(12) United States Patent
Tsai et al.

(10) Patent No.: US 7,015,065 B2
(45) Date of Patent: Mar. 21, 2006

(54) MANUFACTURING METHOD OF BALL GRID ARRAY PACKAGE

(75) Inventors: Yu-Fang Tsai, Kaohsiung (TW); Jung-Kun Kang, Kaohsiung (TW); Tsung Yueh Tsai, Kaohsiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 10/876,452

(22) Filed: Jun. 28, 2004

(65) Prior Publication Data

US 2005/0090043 A1    Apr. 28, 2005

(30) Foreign Application Priority Data

Oct. 24, 2003   (TW) ............................... 92129691 A

(51) Int. Cl.
*H01L 21/44*       (2006.01)
(52) U.S. Cl. ..................... 438/106; 257/734; 257/735; 257/736
(58) Field of Classification Search ........ 257/734–738; 438/106–109
See application file for complete search history.

(56) References Cited

U.S. PATENT DOCUMENTS

| | | | |
|---|---|---|---|
| 6,762,498 B1 * | 7/2004 | Morrison et al. ............ | 257/758 |
| 6,774,497 B1 * | 8/2004 | Qi et al. ..................... | 257/783 |
| 6,825,108 B1 * | 11/2004 | Khan et al. ................. | 438/613 |
| 6,861,294 B1 * | 3/2005 | Tsunoda et al. ............ | 438/123 |
| 6,903,442 B1 * | 6/2005 | Wood et al. ................ | 257/621 |
| 2002/0110956 A1 * | 8/2002 | Kumamoto et al. ........ | 438/108 |
| 2004/0041260 A1 * | 3/2004 | Wood et al. ................ | 257/734 |

* cited by examiner

*Primary Examiner*—Hoai Pham
*Assistant Examiner*—Nathan W. Ha
(74) *Attorney, Agent, or Firm*—Bacon & Thomas, PLLC

(57) ABSTRACT

A manufacturing method of a ball grid array package mainly comprises providing a carrier unit with an upper surface and a lower surface, mounting a plurality of solder balls on the lower surface of the carrier unit, disposing a protective layer below the lower surface to cover the solder balls, placing a chip on the upper surface of the carrier unit and electrically connecting the carrier and the chip, encapsulating the chip and removing the protective layer so as to form said ball grid array package.

15 Claims, 6 Drawing Sheets

MANUFACTURING METHOD OF BALL GRID ARRAY PACKAGE

BACKGROUND OF THE INVENTION

1. Field of Invention

This invention relates to a manufacturing method of a ball grid array package. More particularly, the present invention is related to a manufacturing method of a ball grid array package in a thin type.

2. Related Art

In this information explosion age, integrated circuits products are used almost everywhere in our daily life, for example electronic products having powerful functions, personalized performance and a higher degree of complexity, and integrated circuits (chip) packaging technology is becoming a limiting factor for the development in packaged integrated circuits of higher performance. Accordingly, semiconductor package designers are struggling to keep pace with the increase in pin count, size limitations, low profile, and other evolving requirements for packaging and mounting integrated circuits.

In the filed of integrated circuits packaging, a ball grid array package (BGA package) is a common type utilized in ICs packaging for that the BGA package has low grounded impedance, low power impedance and more pin counts and is more applicable to high-density ICs package. Usually, BGA package employees a carrier made of a material selected from Bismalesimide-Triazine (BT) and polyimide (PI) to carry a chip and gold wires to make electrical connection between the chip and the carrier. Therein, one of the surface of the carrier has solder balls arranged in a matrix and taken as electrical connection to transmit electrical signals to external devices such printed circuit boards (PCBs). Besides, the chip can be mounted onto the carrier through a plurality of bumps to form a ball grid array package in a flip chip fashion.

Moreover, another low and thin ball grid array package, such as a chip scale package (CSP) is provided to meet the requirement of the package with a lower profile. However, no matter what the type of the ball grid array package is, the manufacturing method of a conventional ball grid array package mainly comprises following steps. Firstly, as shown in FIG. 1, a carrier unit 11 is provided, wherein the carrier unit comprises a chip pad 112, contacts 114 encompassing the chip pad 112. Next, a chip 12 is disposed on the chip pad 112 and fixed on the chip pad 112 by curing an adhesive (not shown), such as silver paste. Afterwards, gold wires 13 are wire-bonded to the contacts 114 and then an encapsulation is provided to encapsulate the chip 12, the contacts 113, the gold wires 114, the surface of the carrier unit 11. Then, a marking process is performed to form a mark on the surface of the encapsulation 14 for identification. Finally, a solder-balls placing process is performed to attach the solder balls 15 to the surface of the carrier unit opposed to the surface carrying the chip 12 so as to complete the packaging process.

Because the carrier unit 11 is usually warped after the encapsulation 14 is formed to cover the chip 12, the solder balls placing process is difficult to perform and the solder balls 15 can not be mounted to the correct locations of the carrier unit 11 due to said warpage of the carrier unit 11. Particularly, the thinner the carrier unit is, the dislocation of the solder balls 15 being disposed on the carrier unit 11 is easily happened.

Therefore, providing another manufacturing method of ball grid array package to solve the mentioned-above disadvantages is the most important task in this invention.

SUMMARY OF THE INVENTION

In view of the above-mentioned problems, this invention is to provide a manufacturing method of ball grid array package with a thin type to prevent the solder balls placed on the carrier unit from being dislocated.

To achieve the above-mentioned, a manufacturing method of ball grid array package is provided, wherein the manufacturing method mainly comprises the following steps. Firstly, a carrier unit is provided, wherein the carrier unit comprises a chip pad, contacts encompassing the chip pad. Next, a solder-balls placing process is performed to attach the solder balls to the surface of the carrier unit opposed to the surface having the chip pad. Then, a reflowing process is performed to securely fix the solder balls to the carrier unit. Afterwards, a protective layer, such as a protective film, is provided to be disposed below the carrier unit to cover the solder balls. Next, a chip is disposed on the chip pad and fixed on the chip pad by curing an adhesive, such as silver paste. Then, gold wires are wire-bonded to the contacts and then an encapsulation is provided to encapsulate the chip, the contacts, the gold wires, and the upper surface of the carrier unit. Then, a marking process is performed to form a mark on the surface of the encapsulation for identification. Finally, the protective layer is removed to complete the ball grid array package.

In summary, as specified above, this invention provide a manufacturing method to prevent the solder balls attached to the carrier unit from being dislocated due to the warpage of the carrier unit after the encapsulation covers the chip, the gold wires and the upper surface of the carrier unit.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

The manufacturing method of ball grid array package according to the preferred embodiment of this invention will be described herein below with reference to the accompanying drawings, wherein the same reference numbers refer to the same elements.

Figure 1:
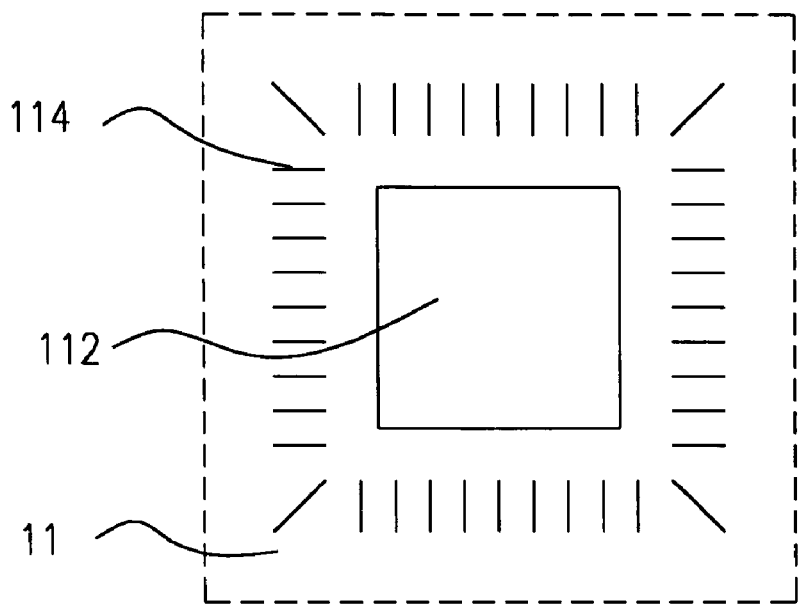
FIGS. 1 to 3 are partially enlarged cross-sectional views showing the progression of steps for manufacturing ball grid array package according to the conventional manufacturing method.
Figure 2:
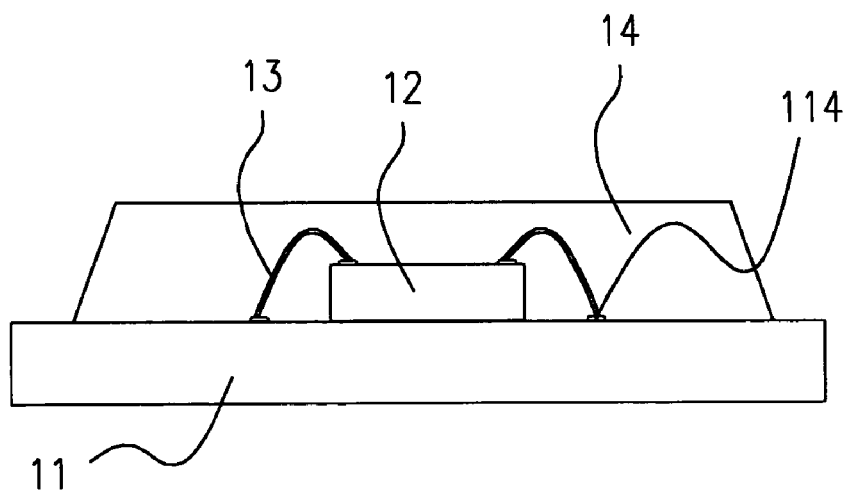
Figure 3:
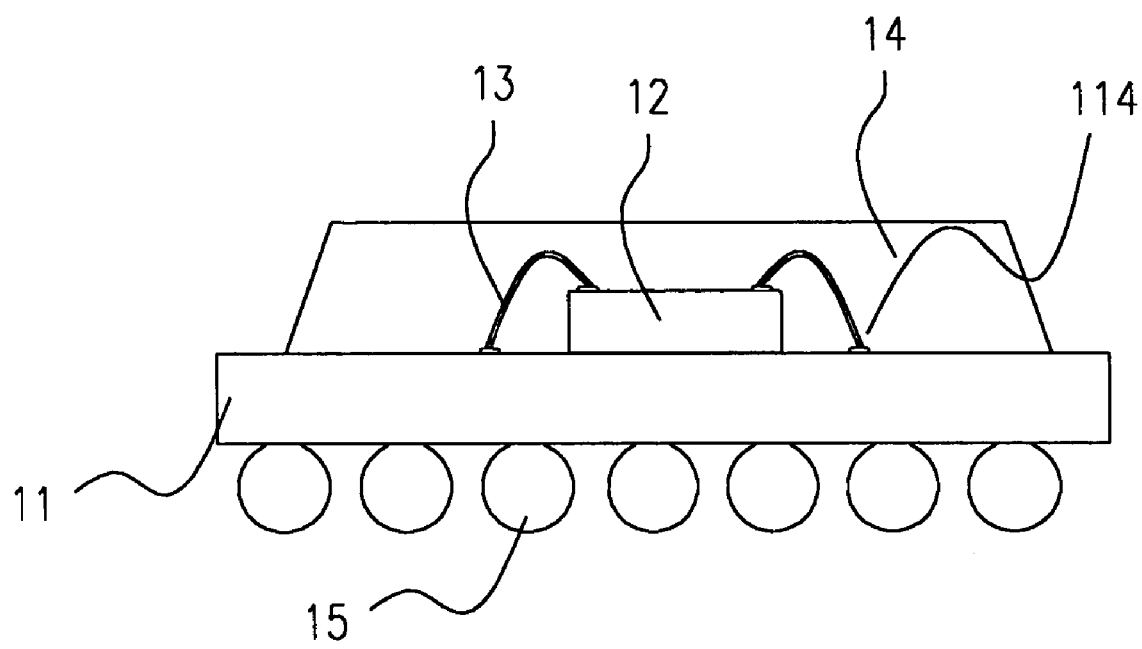
Figure 4:
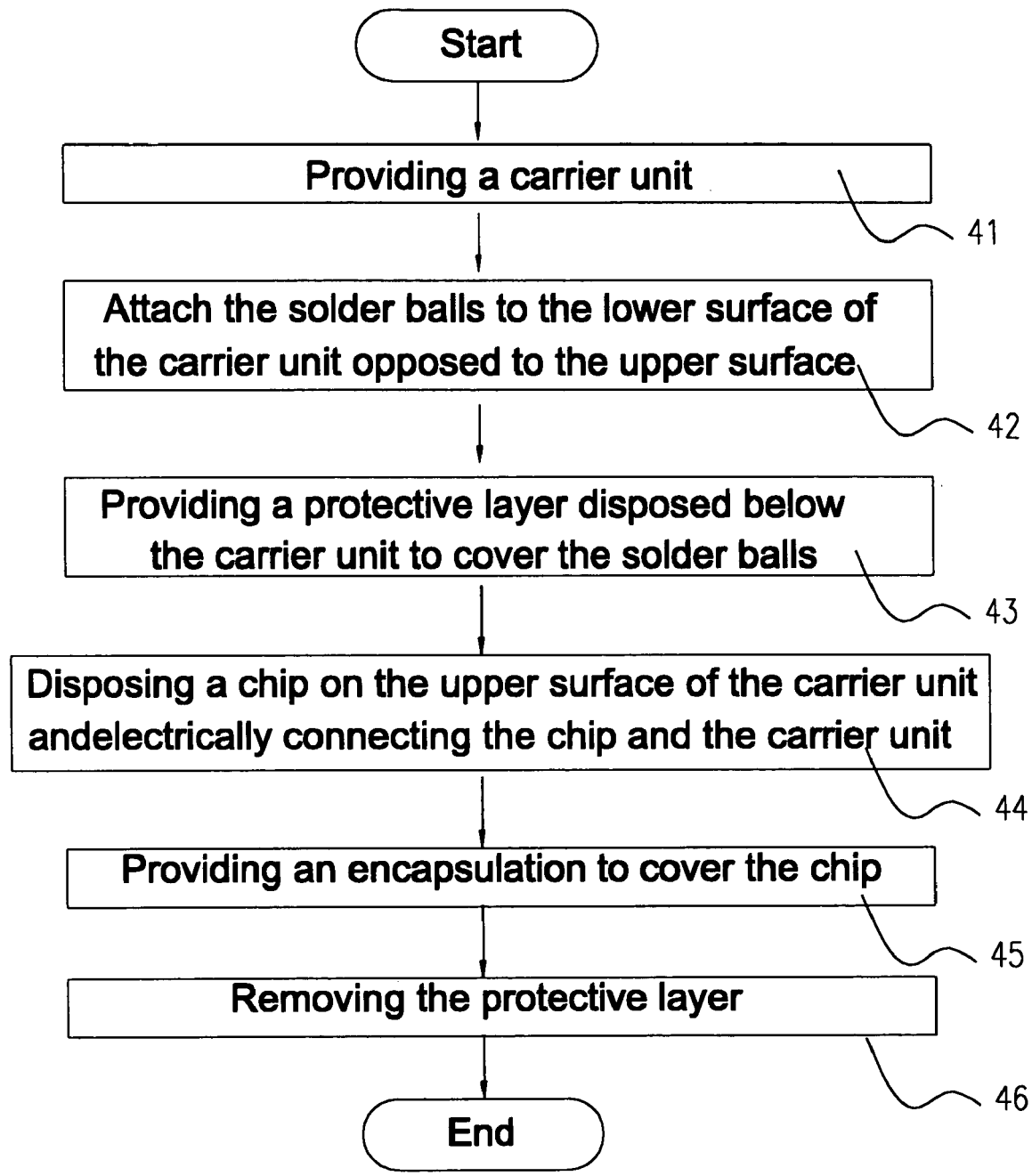
FIG. 4 is a flow chart illustrating the process flow of a manufacturing method of the ball grid array package according to the preferred embodiment of this invention.
Figure 5:
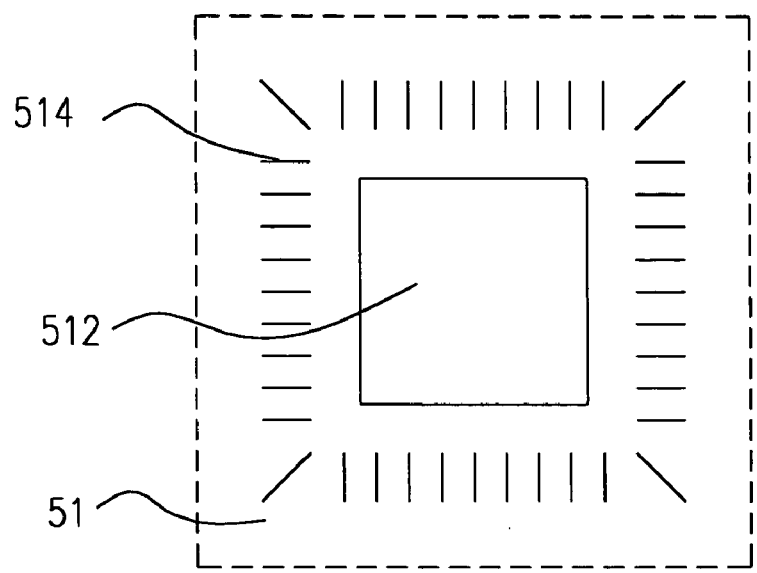
FIGS. 5 to 10 are partially enlarged cross-sectional views showing the progression of steps for manufacturing ball grid array package according to the preferred embodiment of this invention.
Figure 6:
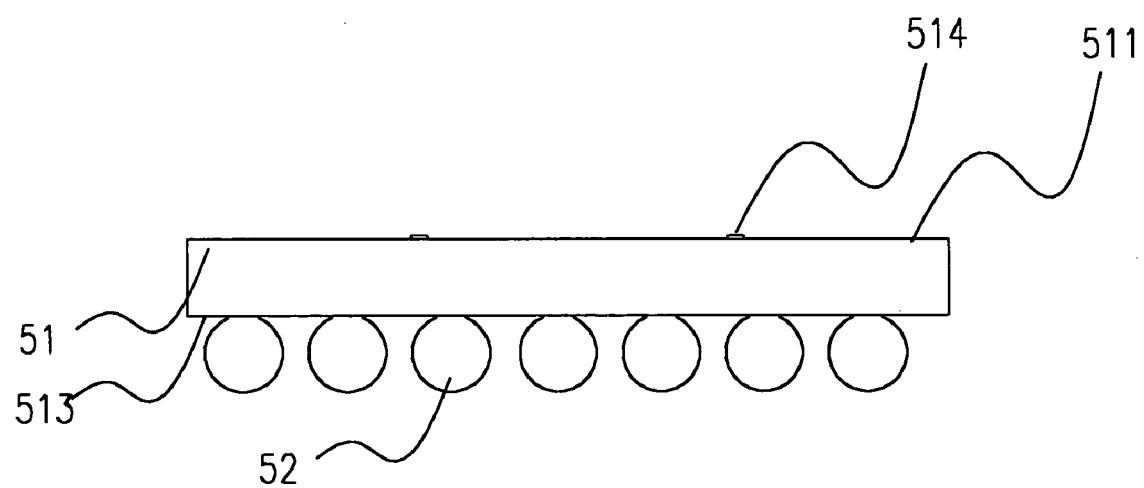
Figure 7:
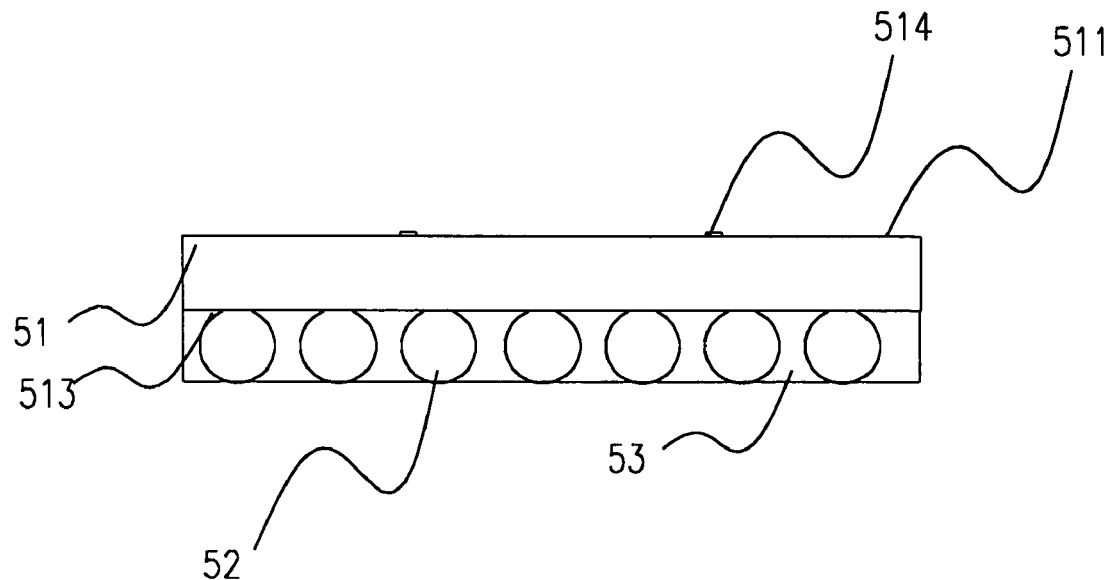
Figure 8:
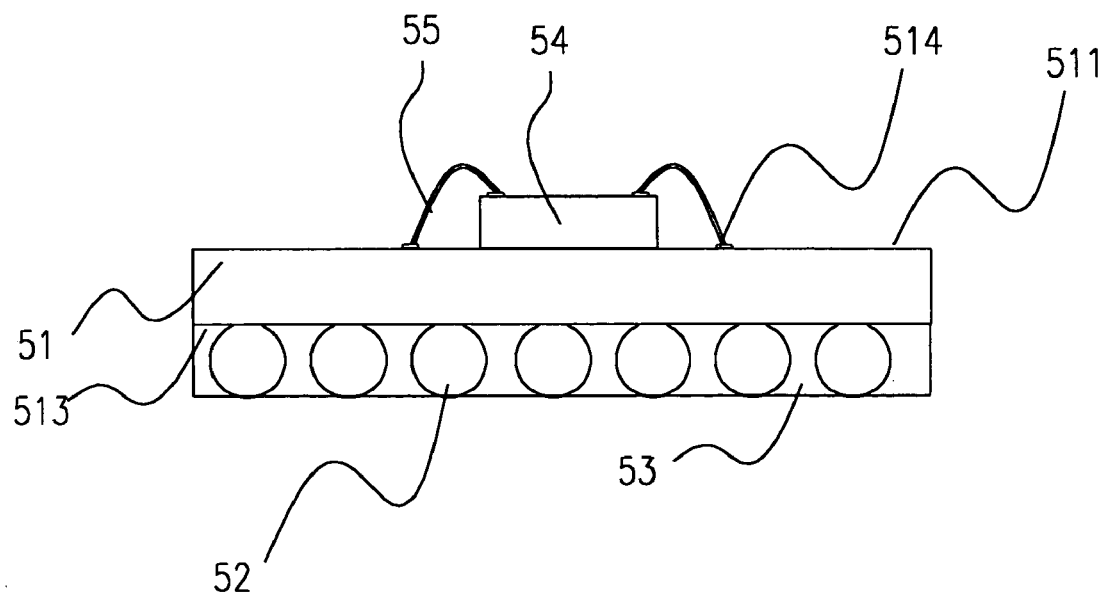
Figure 9:
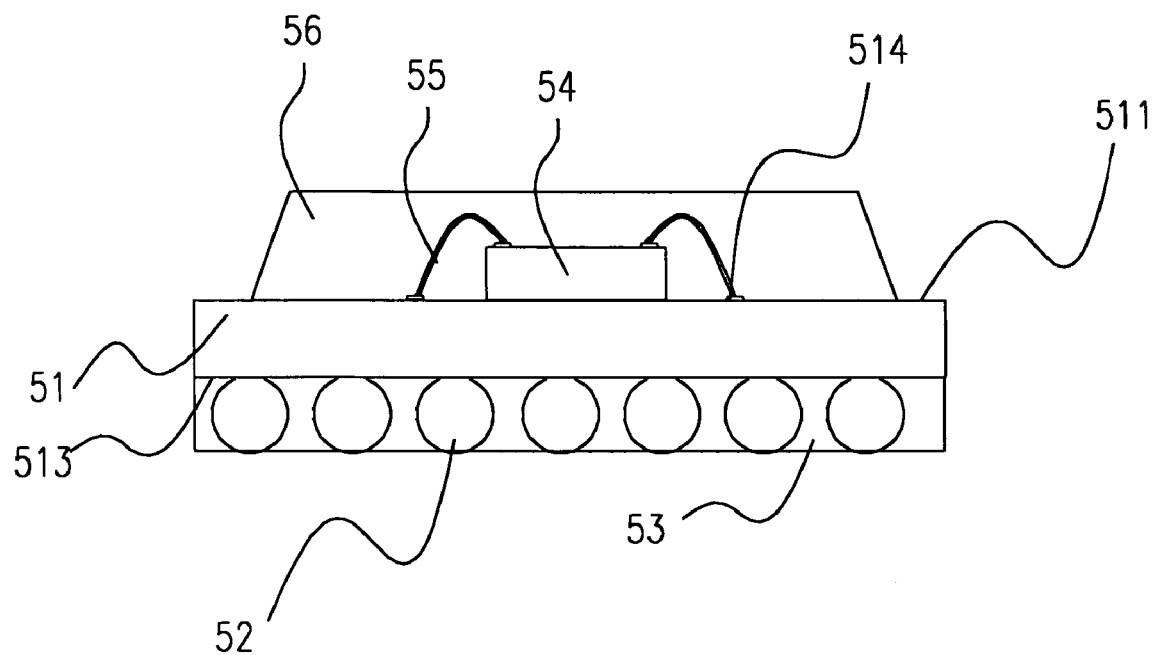
Figure 10:
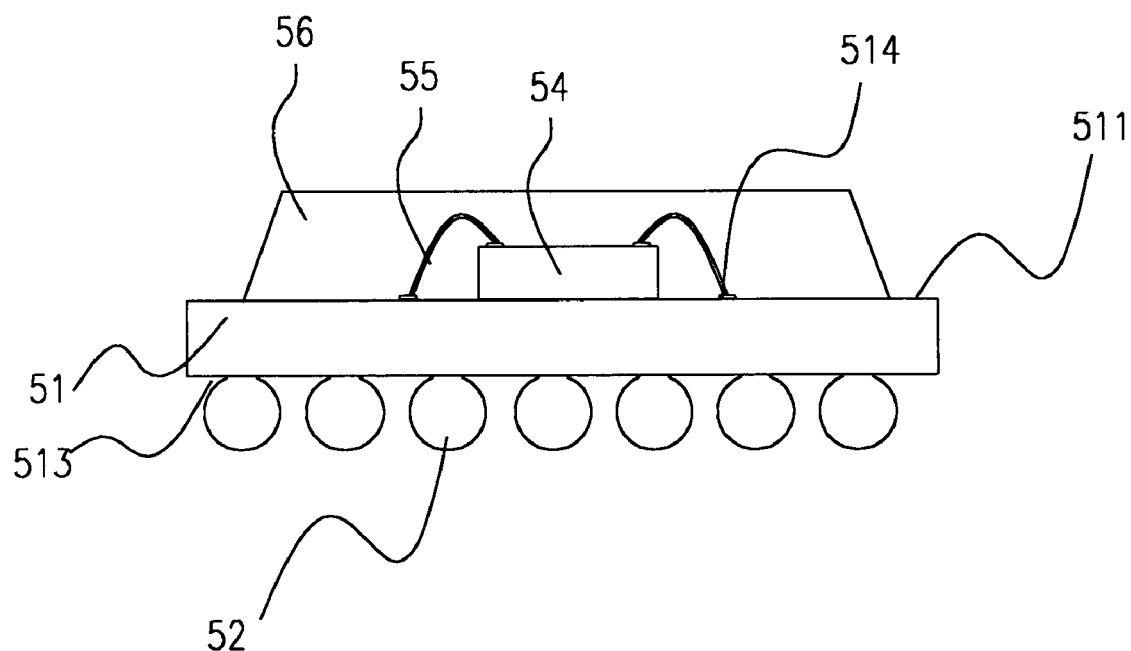

Referring to FIG. 4 and referring to the drawings provided from FIG. 5 to FIG. 10, which show the flow chart and the partially enlarged cross-sectional views showing the progression of steps for manufacturing ball grid array package according to the preferred manufacturing method. In the step 41, a carrier unit 51 is provided, wherein the carrier unit 51 comprises an upper surface 511, a chip pad 512, contacts 514 encompassing the chip pad 512 and a lower surface 513 as shown in FIG. 5. Next, as shown in FIG. 6, a solder-balls placing process as specified in the step 42 is performed to attach the solder balls 52 to the lower surface 513 of the carrier unit 51 opposed to the upper surface 511. Then, optionally, a reflowing process is performed to fix the solder balls 512 securely to the carrier unit 51. Afterwards, a protective layer 53, such as a protective film, is provided, as shown in FIG. 7, to be disposed below the carrier unit 51 to cover the solder balls 512 as shown in the step 43. Next, as shown in FIG. 8, a chip 54 is disposed on the chip pad 512 and fixed on the chip pad 512 by curing an adhesive, such as silver paste, and then gold wires 55 are wire-bonded to the contacts, or the chip is flip-chip bonded to the carrier unit through bumps (not shown). Afterwards, in the step 45, an encapsulation 56 is provided to encapsulate the chip 51 and the carrier unit as shown in FIG. 9. Finally, the protective layer 53 is removed to complete the ball grid array package. To be noted, the protective layer 53 may be a tape or a film and directly covers the solder balls 512. Moreover, a marking process is performed to form a mark on the surface of the encapsulation 56 for identification after the encapsulation 56 is formed.

As mentioned above, the encapsulation 56 is made of a material with a larger coefficient of thermal expansion (CTE), which is usually about 30 ppm/° C., and the carrier unit 51 is made of a material of smaller CTE than that of the encapsulation 56. For example, the CTE of an organic substrate is almost about 14 ppm/° C. and much smaller than that of the encapsulation 56. Accordingly, the carrier unit 51 is usually warped due to the much difference of the coefficient of thermal expansion between the carrier unit 51 and the encapsulation 56 after the encapsulation 56 is formed. To be noted, a thin carrier unit is more easily warped. Thus, it is more easily to cause the solder balls not well mounted to the carrier unit and to cause the solder balls placed on the carrier unit in a dislocation manner. Before the encapsulation is formed, the carrier unit is kept flat so as to have the solder balls placed and attached to the carrier unit more easily. Thus, the solder balls will be easily placed on the carrier unit based upon the preferred manufacturing method of this invention.

Although the invention has been described in considerable detail with reference to certain preferred embodiments, it will be appreciated and understood that various changes and modifications may be made without departing from the spirit and scope of the invention as defined in the appended claims.

What is claimed is:

1. A manufacturing method of a ball grid array package, comprising:
   providing a carrier unit having an upper surface and a lower surface;
   mounting a plurality of solder balls to the lower surface;
   disposing a protective layer below the carrier unit to cover the whole surface of the solder balls;
   disposing a chip on the upper surface of the carrier unit after disposing the protective layer;
   electrically connecting the chip and the carrier unit;
   providing an encapsulation to cover the chip; and
   removing the protective layer after providing the encapsulation.

2. The manufacturing method of claim 1, further comprising a step of reflowing the solder balls to be fixed to the carrier unit before the chip is disposed on the upper surface of the carrier unit.

3. The manufacturing method of claim 1, wherein the step of electrically connecting the chip and the carrier unit is performed by bonding a plurality of wires to the carrier unit and the chip.

4. The manufacturing method of claim 1, wherein the step of electrically connecting the chip and the carrier unit is performed by connecting the carrier unit and the chip through bumps.

5. The manufacturing method of claim 1, wherein the protective layer is a film.

6. The manufacturing method of claim 1, wherein the protective layer is a tape.

7. The manufacturing method of claim 1, wherein the solder balls are placed on the lower surface of the carrier unit by the method of screen-printing.

8. The manufacturing method of claim 1, wherein the carrier unit is an organic substrate.

9. The manufacturing method of claim 1, wherein the carrier unit comprises a chip pad and contacts encompassing the chip pad.

10. The manufacturing method of claim 3, wherein the plurality of wires are gold wires.

11. The manufacturing method of claim 1, wherein the a marking process is performed to form a mark on the surface of the encapsulation for identification.

12. The manufacturing method of claim 1, wherein the chip is fixed on the upper surface of the carrier unit by curing an adhesive.

13. The manufacturing method of claim 12, wherein the adhesive is silver paste.

14. The manufacturing method if claim 1, wherein the chip is flip-chip bonded to the carrier unit through bumps.

15. The manufacturing method of claim 1, wherein the encapsulation material has a larger coefficient of thermal expansion than the carrier unit material.

* * * * *